United States Patent
Hsu et al.

(10) Patent No.: US 7,478,346 B2
(45) Date of Patent: Jan. 13, 2009

(54) DEBUGGING SYSTEM FOR GATE LEVEL IC DESIGNS

(75) Inventors: Yu-Chin Hsu, Cupertino, CA (US); Furshing Tsai, San Jose, CA (US); Wori-Tzy Jong, Campbell, CA (US)

(73) Assignee: Springsoft USA, Inc., San Jose, CA (US)

( * ) Notice: Subject to any disclaimer, the term of this patent is extended or adjusted under 35 U.S.C. 154(b) by 409 days.

(21) Appl. No.: 11/342,125

(22) Filed: Jan. 26, 2006

(65) Prior Publication Data

US 2007/0174805 A1 Jul. 26, 2007

(51) Int. Cl.
*G06F 17/50* (2006.01)
*G06F 9/45* (2006.01)

(52) U.S. Cl. .................. 716/4; 716/1; 716/5; 716/6; 716/18; 703/14; 703/15; 703/19

(58) Field of Classification Search .............. 716/306, 716/18; 703/14, 15, 19
See application file for complete search history.

(56) References Cited

U.S. PATENT DOCUMENTS

| | | | | |
|---|---|---|---|---|
| 6,083,269 | A * | 7/2000 | Graef et al. ................ 703/14 |
| 6,240,376 | B1 * | 5/2001 | Raynaud et al. ............ 703/15 |
| 6,292,931 | B1 * | 9/2001 | Dupenloup ................. 716/18 |
| 6,295,636 | B1 * | 9/2001 | Dupenloup ................. 716/18 |
| 6,601,024 | B1 * | 7/2003 | Chonnad et al. ............ 703/14 |
| 6,678,643 | B1 * | 1/2004 | Turnquist et al. ........... 703/14 |
| 6,694,495 | B1 * | 2/2004 | Hussain et al. .............. 716/4 |
| 6,836,877 | B1 * | 12/2004 | Dupenloup ................. 716/18 |
| 6,980,943 | B2 * | 12/2005 | Aitken et al. ............... 703/14 |
| 7,072,825 | B2 * | 7/2006 | Wang et al. ................ 703/28 |
| 7,137,078 | B2 * | 11/2006 | Singhal et al. .............. 716/1 |
| 7,162,706 | B2 * | 1/2007 | Kuang et al. ............... 716/6 |
| 7,219,315 | B1 * | 5/2007 | Stoye et al. ................ 716/4 |
| 7,283,944 | B2 * | 10/2007 | Tsai et al. .................. 703/15 |
| 7,356,786 | B2 * | 4/2008 | Schubert et al. ............ 716/4 |
| 2001/0007972 | A1 * | 7/2001 | Araki et al. ................ 703/16 |
| 2005/0216247 | A1 * | 9/2005 | Ikeda et al. ................ 703/19 |
| 2005/0228630 | A1 * | 10/2005 | Tseng et al. ................ 703/19 |

OTHER PUBLICATIONS

Hsu et al.; "Digital design from concept to prototype in hours"; Dec. 5-8, 1994; Circuits and Systems, 1994. APCCAS '94., 1994 IEEE Asia-Pacific Conference on; pp. 175-181.*

* cited by examiner

*Primary Examiner*—Helen Rossoshek
(74) *Attorney, Agent, or Firm*—Daniel J. Bedell; Smith-Hill and Bedell

(57) ABSTRACT

A synthesizer or emulator processes a gate level IC design derived from an RTL design to produce a gate level dump file indicating how signals of the gate level design behave. The gate level dump file is converted into an RTL dump file indicating how signals of the RTL design behave. A debugger processes the RTL dump file to produce displays depicting the RTL design and behavior of signals indicated by the RTL dump file. Thus while the IC is simulated or emulated at the gate level of the design to produce waveform data for a debugger, the gate level-to-RTL dump file conversion process enables a designer debug the more familiar RTL design based on the gate level simulation or emulation results. file conversion process enables a designer debug the more familiar RTL design based on the gate level simulation or emulation results.

7 Claims, 5 Drawing Sheets

DEBUGGING SYSTEM FOR GATE LEVEL IC DESIGNS

BACKGROUND OF THE INVENTION

1. Field of the Invention

The invention relates in general to a system for debugging an integrated circuit (IC) design, and in particular to a debugging system that relates gate level simulation, emulation or IC testing results to a register transfer level design.

2. Description of Related Art

An IC designer initially creates a "register transfer level" (RTL) design, also called a "register transfer logic" design, describing a digital electronic circuit as a hierarchy of logic modules that transmit data signals to one another via registers or other clocked devices that store information between clock cycles. The RTL design typically uses high level expressions to describe the logical relationships between the input and output signals of each block of logic.

The designer uses a computer-aided synthesis tool to convert the RTL design into a gate level design describing the IC as a set of interconnected instances of components ("cells") such as transistors, logic gates, memories and the like that carry out the logic described by the RTL design. A cell library, usually provided by IC fabricator, describes the structure and behavior of each cell. The designer then uses computer-aided layout tools to generate an IC placement and routing plan for guiding IC fabrication, the plan indicating the position and orientation of each cell within the IC and describing the layout of the conductive nets that are to interconnect the cells.

At each stage of the design process, the designer uses verification tools such as simulators and emulators to determine whether the IC described by an RTL or gate level design will behave as expected. As illustrated in FIG. 1, to test an IC design at the gate level using a simulator or an emulator 12, the designer supplies it with a testbench 10 including the RTL or gate level design and a signal specification describing the time-varying behavior of IC input signals and specifying the particular IC signals that are to be monitored during the simulation or emulation. The simulator or emulator 12 then produces a dump file 14 indicating the time-varying behavior of the monitored IC signals in response to the specified IC input signal behavior. A computer-based debugger 16 processes dump file 14 to produce waveform displays indicating the behavior of the monitored signals and processes the RTL or gate level design to produce a source code listing, schematic diagrams and other displays cross-referenced to signal behavior data to help a user detect signal errors and ascertain the sources of those errors within the RTL or gate level design.

IC test engineers commonly employ IC functional testers for testing an IC after fabrication. A functional tester monitors the response of various IC signals as it stimulates an IC with input signals having specified time-varying behavior. FIG. 2 depicts a typical prior art IC functional testing and debugging process. A test program 18 supplied to a tester 20 indicates the time varying behavior of input signals the tester is to supply to an IC under test 22 derived from a gate level design 23 and indicates the expected behavior of IC signals to be monitored. Test program 18 is often based on previously generated gate level simulator or emulator dump file 24 so that it as nearly as possible stimulates the IC using the same input signal pattern used by simulator or emulator test bench. As it tests IC 22, tester 20 typically produces pass/fail data 26 indicating when monitored signals state fail to match states predicted by the gate level dump file. A debugger 26 may then process gate level dump file 24 and pass/fail data 26 to produce waveform displays of the monitored signals and indicating when signals are of unexpected states. Debugger 26 may also generate listings or schematic diagrams or other displays that cross-reference the observed signals to the gate level design 23 to help the user debug the IC design.

An IC designer normally prefers to think of the IC in terms of the hierarchical RTL design because that is the design the designer created and is easiest to understand. As it converts the RTL design into a gate level design, a computer-aided synthesis tool replaces the easy to understand RTL description of the circuit logic with a gate level description of circuit logic that eliminates the hierarchal nature of the design and that is much more difficult for a designer to understand. When the designer uses debugger 16 of FIG. 1 to review simulator or emulation results of the RTL design, the debugger correlates the signal behavior provided in dump file 14 to the various signals that appear in the RTL design that is familiar to the designer and therefore somewhat easier to debug than the gate level design. However, when the designer or test engineer uses debugger 16 of FIG. 1 or debugger 26 of FIG. 2 to review simulation, emulation or IC test results, the debugger 16 or 26 correlates the signal behavior described by dump file 14 or test data 26 to the gate level design which is more complicated and less familiar to the designer or test engineer, and therefore more difficult to debug.

SUMMARY OF THE INVENTION

The invention relates to a method for debugging an IC design. A circuit designer originally produces an RTL design describing the IC as comprising a hierarchy of logic modules communicating via signals passing through registers or other clocked devices, and describing the logic modules by describing logical relationships between the signals they receive and signals they generate. A computer-aided synthesis tool then processes the RTL design to synthesize a flat (non-hierarchical) gate level design for the IC describing the logic blocks as comprising interconnected instances of cells. A synthesizer or emulator then processes the gate level design to produce a gate level dump file referencing signals of the gate level design and indicating how those signals would behave in response to time-varying signals supplied as inputs to the IC.

In accordance with one aspect of the invention, the gate level dump file is processed to produce an RTL dump file referencing signals of the hierarchical RTL design, rather than of the gate level design, and indicating how those signals would behave in response to the time-varying signals supplied as inputs to the IC. A debugger then processes the RTL dump file to produce displays depicting the RTL design and the behavior of signals of the RTL design indicated by the RTL dump file. The gate level-to-RTL dump file conversion process enables the designer to debug the RTL design, rather than the gate level design, based on the gate level simulation or emulation or results. Since the hierarchical RTL design is easier for a designer to understand than the flat gate level design, the invention helps simplify the debugging process.

In accordance with another aspect of the invention, the output of an IC tester indicating IC signal behavior is converted into an RTL level dump file referencing signals of the IC's original RTL design and depicting the behavior of those signals during the test. A debugger then processes the RTL dump file to produce displays correlating the RTL design to the behavior of signals of the RTL design. The tester output-to-RTL dump file conversion process enables a test engineer to debug the hierarchical RTL level of the design based on test results, which is typically easier to comprehend than the flat gate level design.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The invention relates to a system for debugging an integrated circuit (IC) design and this portion of the specification describes a preferred mode of practicing the invention. Although the description below includes numerous details in order to provide a thorough understanding of that particular mode of practicing the invention, it will be apparent to those of skill in the art that other modes of practicing the invention recited in the claims need not incorporate all such details.

Figure 1:
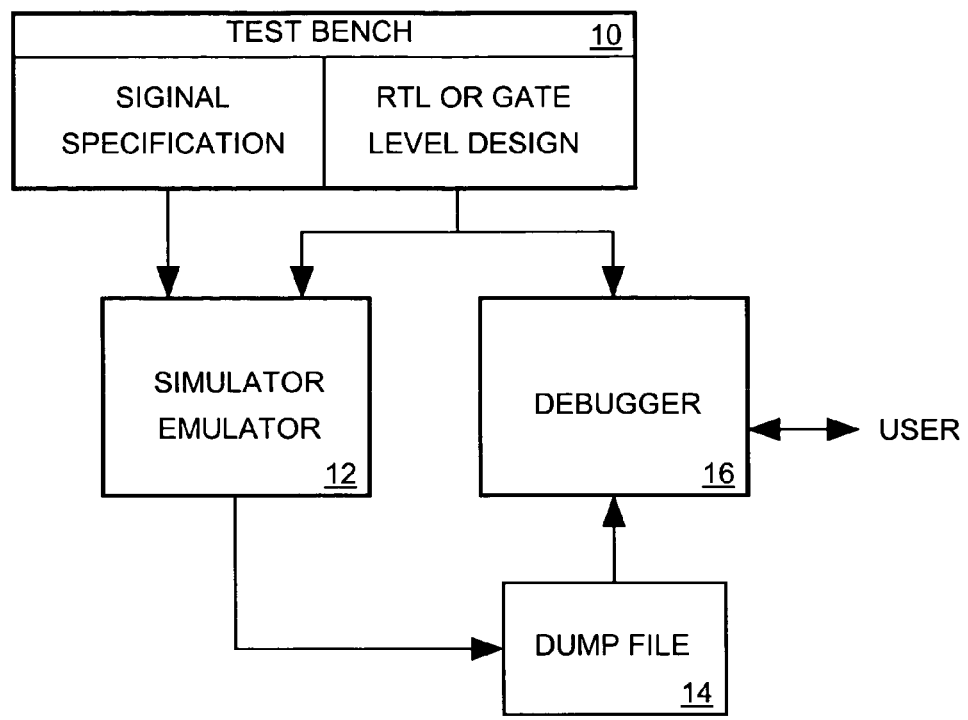
FIG. 1 is a data flow diagram depicting a prior art method for debugging an integrated circuit design.
Figure 2:
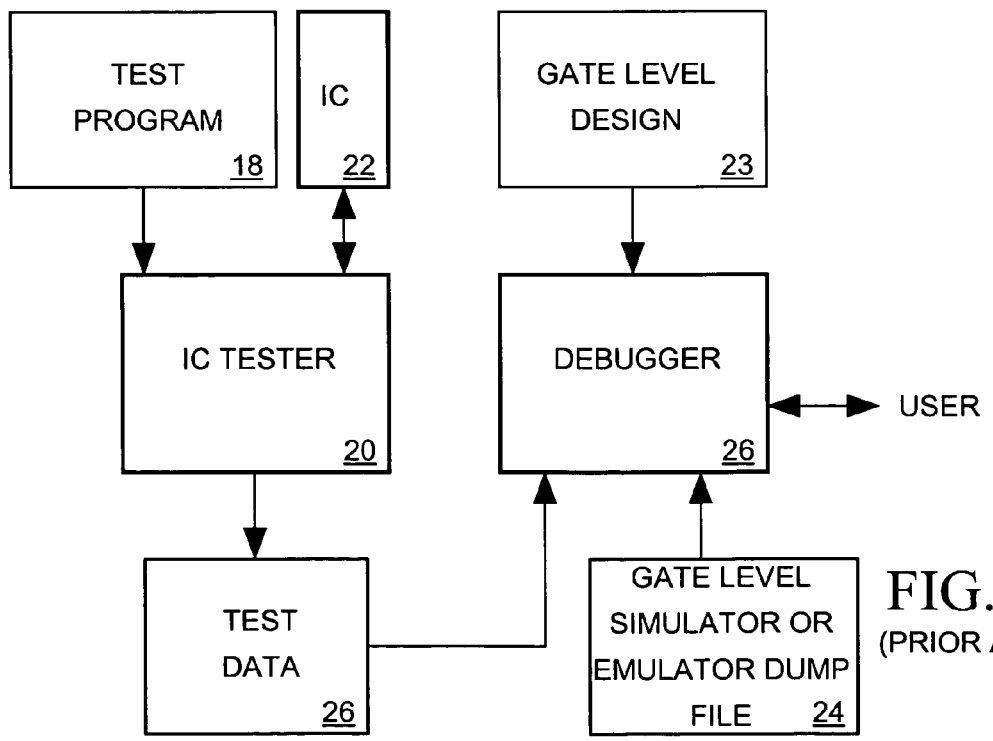
FIG. 2 is a data flow diagram depicting a prior art method for testing and debugging an integrated circuit.
Figure 3:
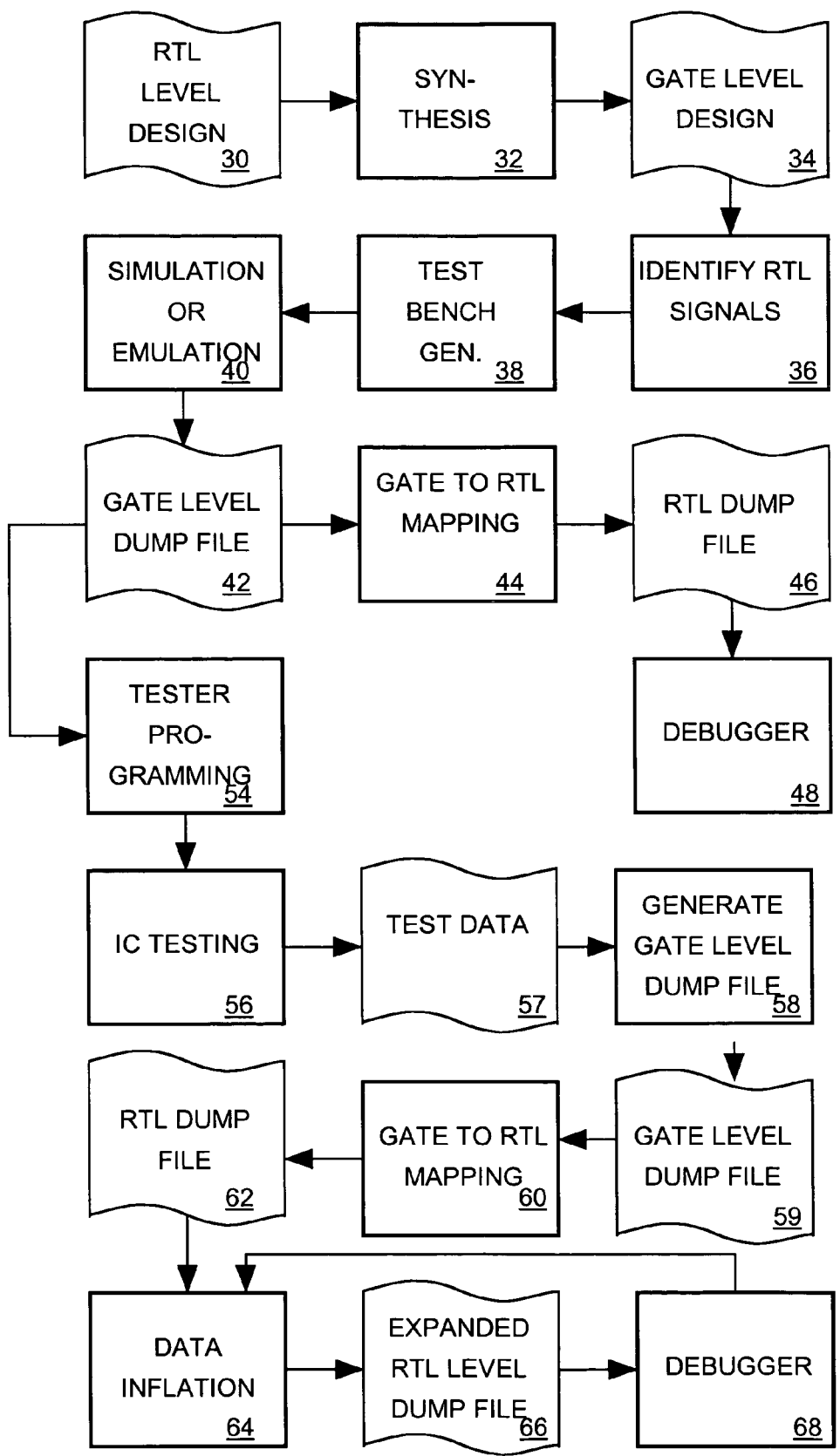
FIG. 3 is a data flow diagram depicting a method in accordance for debugging an integrated circuit design.

FIG. 3 is a data flow diagram illustrating an IC development process employing a debugging method in accordance with invention. An IC designer initially generates a text based register transfer level (RTL) IC design 30. A digital IC employs clocked devices such a registers, latches and flip-flops to synchronize state changes in signals between various blocks of logic to clock signal edges. A designer can think of an IC as being a hierarchy of logic modules for producing output signals as logical combinations of their input signals, a set clocked devices for transferring signals between the logic modules, and a clocking system for clocking the clocked devices. An RTL IC design names each the input or output signals of the logic module, describes timing relationships between all of the IC's clock signals, and normally uses high level expressions such as Boolean algebra to describe logic relationships between the inputs and outputs of each logic module. The RTL design is usually hierarchical in that it organizes low level modules into progressively higher level modules.

Although not shown in FIG. 3, the IC designer will use various computer-aided tools to verify RTL design 30. Once the designer is satisfied that the RTL design 30 is correct, the designer uses a computer-aided synthesis tool (step 32) to convert RTL design 30 into a gate level design 34 describing the IC as a collection of instances of standard components ("cells") such as transistors, logic gates, input/output ports and the like, each having a structure and behavior described in a cell library.

The gate level design 34 is typically flat in that, unlike the RTL design 30, it does not organize IC logic into a hierarchy of modules. In an RTL design, signals residing within different modules or residing at differing levels of the hierarchy can have the same name, but similarly named signals can be distinguished from one another by their positions within the modular design hierarchy. Since the synthesizer eliminates the hierarchal nature of the RTL design, it is not possible to use the position of a signal within that design hierarchy to distinguish one signal from another when they have the same name. It is therefore necessary at step 32 for the synthesizer to rename the signals so that each signal has a unique name. Thus while for each signal in RTL design 30 there is a corresponding signal in gate level design 34, corresponding signals will not necessarily have the same name. The gate level design 34 will also include signals that do not appear in the RTL design 30 because in addition to referencing the input and output signals of each logic module, the more detailed gate level design must also include signals that cells forming modules of the RTL level design use to communicate with one another.

Since the gate level of the design for a large IC will have a large number of signals, it can be time-consuming for a simulator or emulator to record every state change in every signal because it must occasionally halt the simulation or emulation process and write signal state change data to a hard disk. The more signals it must monitor and record, the more frequently a simulator or emulator must perform time-consuming disk accesses. Since the designer typically views an IC in terms of RTL design 30, and would like to debug the IC design at that level, the designer is often less interested in observing the behavior of the signals that do not appear in the RTL design, such as the internal signals of logic modules detailed by the synthesis tool at step 32.

In accordance with one aspect of the invention, gate level design 34 is analyzed (step 36) to identify the signals of the gate level design 34 that also appear in the RTL design 30, though perhaps under a different name. The RTL signals include the IC's primary input and output signals and the signals passing through registers and other clocked devices between the various logic modules. The RTL signals do not include the internal signals of logic modules that appear only in the gate level design 34. At step 38, the designer (step 36) generates a testbench for programming a simulator or emulator 40 to mimic the behavior of the IC described by gate level design 34. Test bench 38, which incorporates gate level design 34, includes descriptions of the time-varying behavior of the IC's primary input signals and tells the simulator or emulator to record in a gate level dump file 42 state change data only for RTL signals identified at step 36. Dump file 42 indicates the times during the simulation at which each monitored RTL signal changes state and the state to which it changed.

In accordance with one aspect of the invention, following the simulation or emulation process at step 40, the gate level dump file 42 is mapped into an RTL dump file 46 at step 44. As discussed above, while for every signal of the RTL design 30 there is a corresponding signal in gate level design 34, the two signals may not have the same name because, when it flattens the design by eliminating its hierarchical structure, synthesis tool 32 renames similarly named signals that were distinguished in the RTL design 30 only by their relative positions within the design hierarchy. Thus while gate level dump file identifies each signal only according to its name in gate level design 34, RTL dump file 46 identifies each signal not only according to its name in the RTL design 30 but also according to its position within the RTL design hierarchy.

Figure 4:
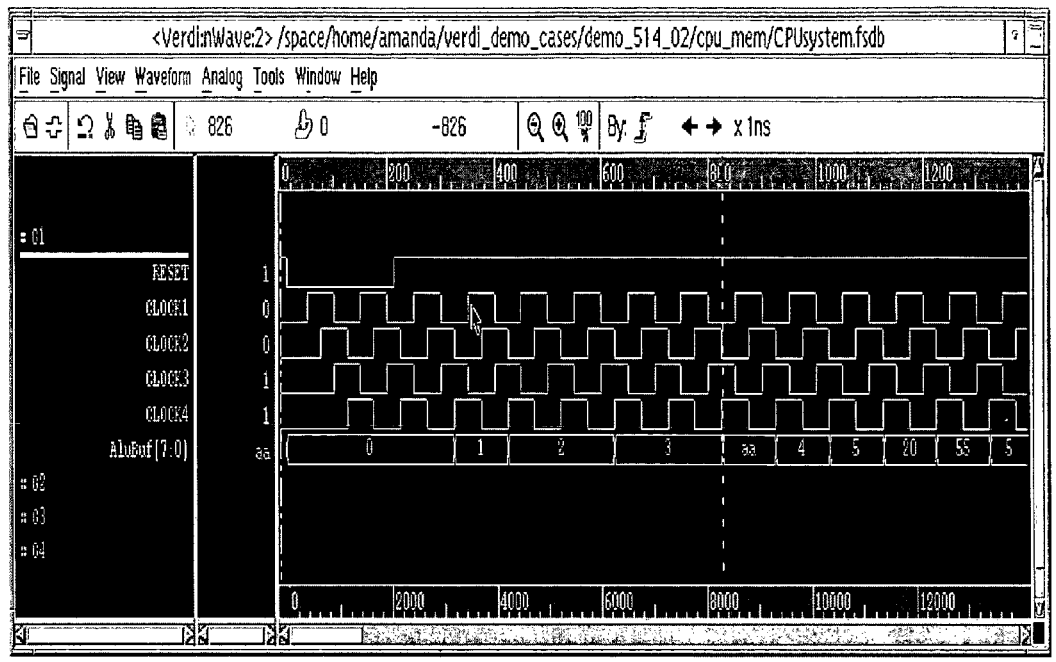
FIGS. 4-7 are views of display produced by a testing and bugging system in accordance with the invention.
Figure 5:
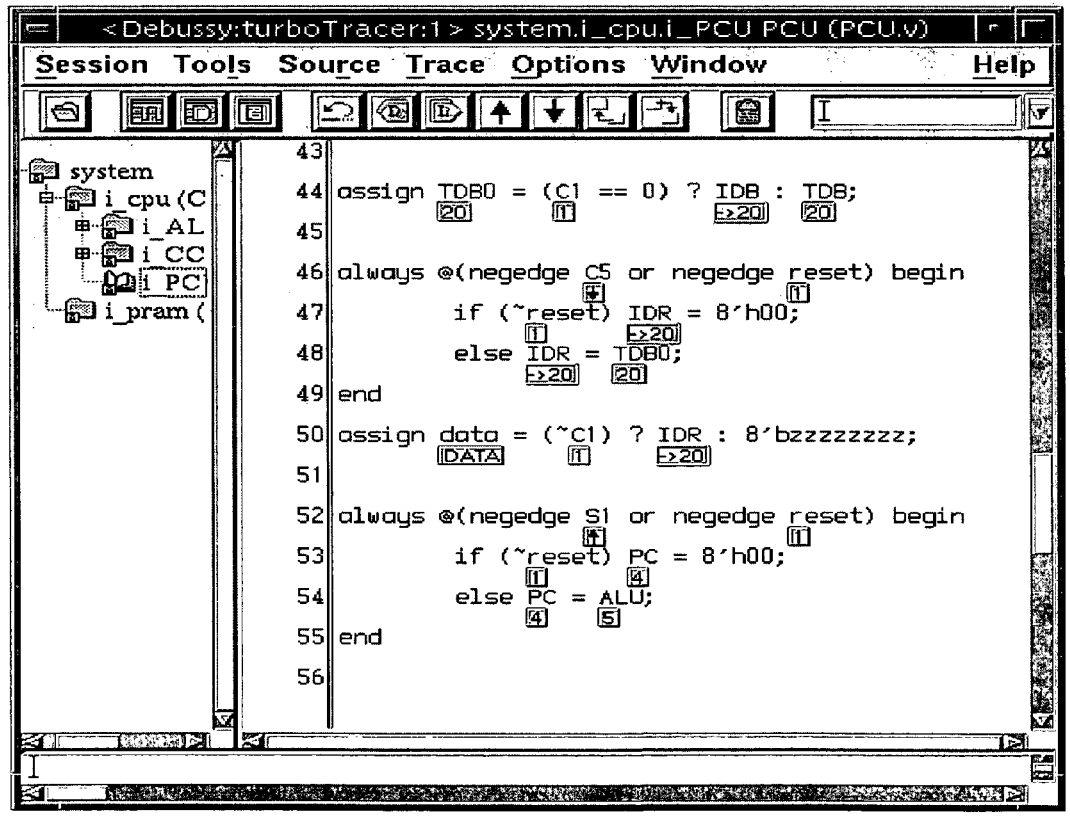
Figure 6:
Figure 7:
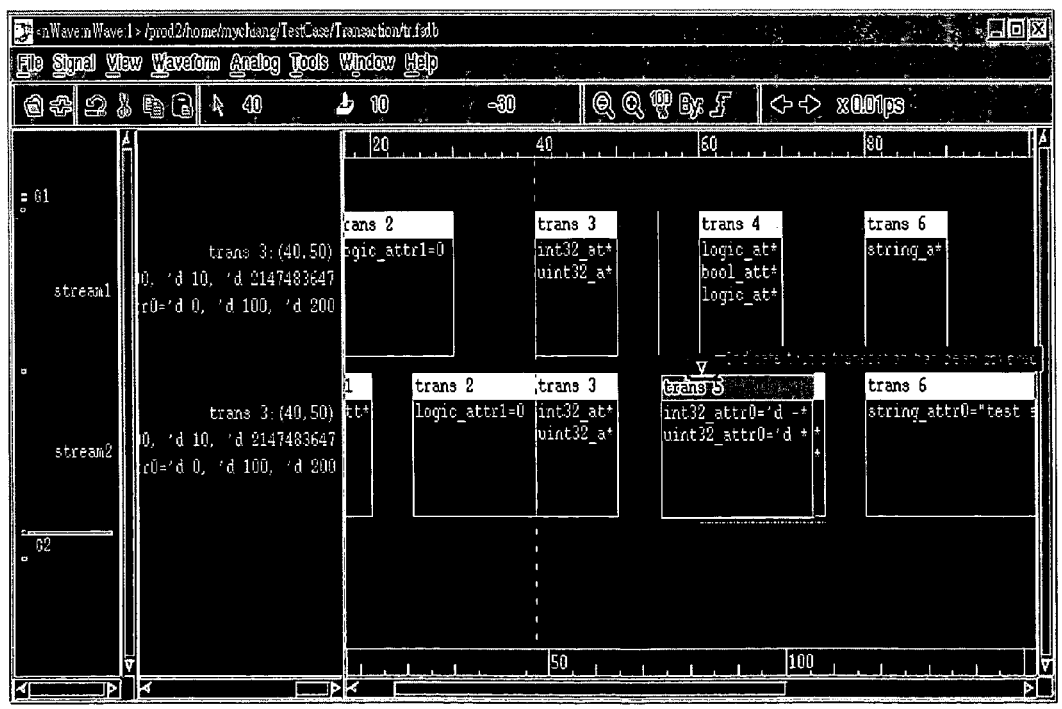

The RTL dump file 46 provides input to a conventional debugger 48 allowing the designer to view waveforms, as illustrated for example in FIG. 4, depicting the behavior of the signals described by the RTL dump file 46. Debugger 48 can also produce displays of RTL design 30 to enable the designer to correlate each signal described by the RTL dump file to the RTL design. For example FIG. 5 depicts a debugger display of a portion of an RTL listing showing states or values of various signals at a particular time during the test. FIG. 6 depicts a schematic diagram display of a portion of an RTL design, also showing states or values of various signals at a particular time during the test. Debugger 48 can also process the RTL dump file data to determine the high level transactions various waveform sequences represent and to produce a display as depicted in FIG. 7 identifying such transactions.

After the IC designer has successfully debugged the gate level design, he or she will use conventional placement and routing tools to generate a layout for the IC describing the position and orientation of each cell within the IC and describing the layout of each net interconnecting the cells. After using various tools to verify the layout, the designer will forward the layout to a fabricator who will then fabricate ICs based on that layout. A test engineer (at step 54) programs an IC functional tester to test the ICs (step 56) by supplying input signals to an IC and sampling various signals the IC produces in response to those signals to determine whether they behave as expected.

When programming the functional tester, the test engineer uses the simulator or emulator gate level dump file 42 output as a guide for indicting the behavior of the IC's input signals and for indicating the expected behavior of the IC signals to be monitored. The tester may not be able to directly observe all of the signals represented by data in gate level dump file 42 during the test since not all of the IC's signals appear at an IC's IO terminals or at test points on the surface of the IC that the tester can access via probes.

Figure 8:
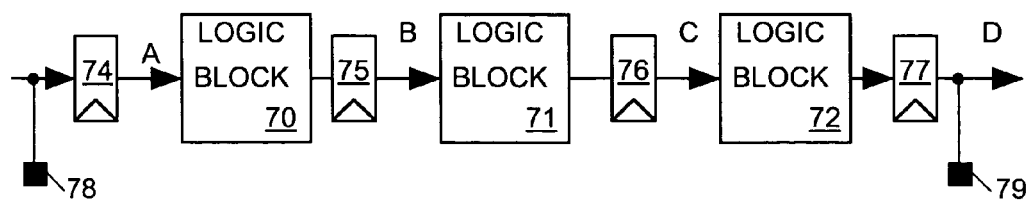
FIGS. 8 and 9 depict a prior art logic circuits in block diagram form.
Figure 9:
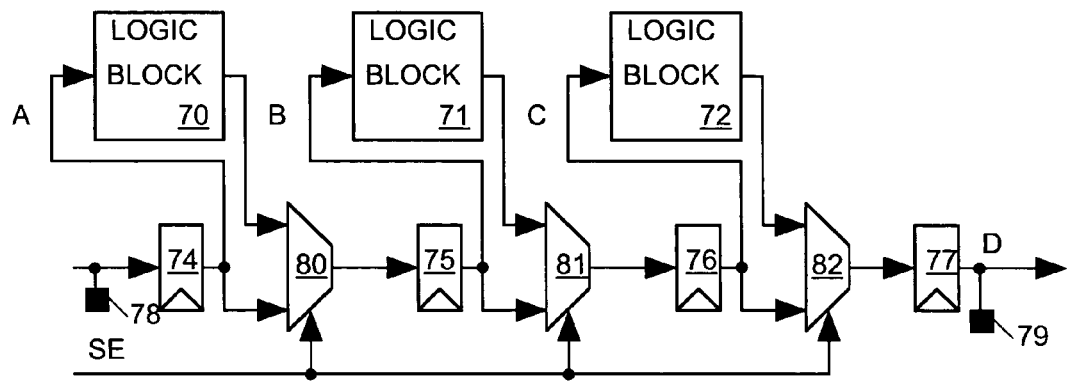

Sometimes an IC's registers and other clocked devices form scan chains enabling a tester to observe the contents of those devices, and in such case a test engineer can program the tester at step 54 to use scan chains to observe states of such signals as selected times during the test. As illustrated, for example in FIG. 8, a IC might include a series of logic blocks communicating via signals A-D passing through a set of registers 74-77. Signals A and D may be accessible to a tester via a probe pad or IC IO port 78 or 79, but signals B and C may not be directly accessible. FIG. 9 shows a modified version of the circuit of FIG. 4 wherein a set of multiplexers 80-82 connected to registers 74-77 form a scan chain. During a normal mode of operation, the tester de-asserts a scan enable signal (SE) so that multiplexers 80-82 configure the circuit so that logic blocks 70-73 communicate in the manner depicted in FIG. 4. During a scan mode of operation, the tester sets scan enable signal SE so that when they are clocked, multiplexers 80-82 serially shift data at the outputs of registers 74-77 outward to the tester from terminal 79 and serial shift data arriving from the tester at terminal 78 to the inputs of registers 74. A tester can occasionally halt a functional test and initiate a scan mode of operation, wherein it reads the states of the signals A-D at the outputs of the registers 74-77 and then resets those signals to those states before setting the scan chain to its normal mode of operation and resuming the functional test.

Since the output test data 57 of an IC tester typically indicates only which signals fail to behave as expected and the test cycles in which those failure occur, the test data 57 is converted at step 58 to a gate level dump file 59 depicting the time varying behavior of the directly monitored gate level signals. At step 60, gate level dump file 59, which references each signal according to its gate level name, is converted into an RTL dump file 62 referencing each signal according to its RTL name and its position within the RTL design hierarchy. RTL dump file 62 is then subjected to a "data inflation" process 64 in which additional waveform data is generated and added to RTL dump file 62 to produce to produce an expanded RTL dump file 66 supplied as input to a conventional debugger 68 allowing the test engineer to view waveforms depicting the behavior of the signals described by the expanded RTL dump file 66 and to correlate those waveforms to the RTL level design. The additional waveform data added at the data inflation step 64 includes, for example, state data computed from scan data included in test data 57 for signals that are accessed only via scan chains and unobserved RTL signals whose behavior can be deduced from states of observed signals.

Thus has been shown and described a method for designing and debugging an IC that a circuit designer has originally specified in the form of an RTL design describing the IC as comprising a hierarchy of logic modules communicating via signals, and describing the logic modules according to their behavior by describing logical relationships between signals they transmit and receive. A computer-aided synthesizer processes the RTL design to produce a gate level design describing the IC as comprising instances of cells communicating via signals. The gate level design is then processed, for example using a synthesizer or emulator, to produce a gate level dump file referencing signals of the gate level design and indicating how those signals would behave over a period of time in response to time-varying signals supplied as inputs to the IC. The gate level dump file is then processed to produce an RTL dump file referencing signals of the RTL design and indicating how those signals would behave in response to the time-varying signals supplied as inputs to the IC. A debugger then processes the RTL dump file to produce displays depicting behavior of signals indicated by the RTL dump file and correlating those signals to the RTL design. Thus while the system simulates or emulates the gate level design to produce waveform data for a debugger, the gate level-to-RTL dump file conversion process enables the designer debug the RTL design that is more familiar to the designer than the gate level design. In a similar manner converting the output of an IC tester into an RTL level dump file enables a test engineer to debug an IC at the RTL level rather than at the gate level of the design even though the tester results are based on the gate level design.

The invention claimed is:

1. A method for designing and debugging an IC comprising the steps of:
   a. generating a register transfer level (RTL) design for the IC, wherein the RTL design describes the IC as comprising a hierarchy of logic modules communicating via signals, and describes the logic modules according to their behavior by describing logical relationships between signals they transmit and receive;
   b. processing the RTL design to synthesize a gate level design for the IC, wherein the gate level design describes the logic blocks as comprising instances of cells communicating via signals;
   c. processing the gate level design to produce a first gate level dump file referencing signals of the gate level design and indicating how the signals of the gate level design would behave over a period of time in response to time-varying signals supplied as inputs to the IC;
   d. processing the first gate level dump file to produce a first RTL dump file referencing signals of the RTL design and indicating how the signals of the RTL design would behave in response to the time-varying signals supplied as inputs to the IC; and
   e. processing the first RTL dump file to produce displays depicting behavior of signals of the RTL design indicated by the first RTL dump file.

2. The method in accordance with claim 1
wherein the first RTL dump file references signals of the RTL design according their names and positions within the hierarchy of logic modules; and
wherein the gate level design uniquely names every signal generated by every cell, and the first gate level dump file references each signal of the gate level design according to its unique name.

3. The method in accordance with claim 1 wherein step c comprises the substeps of:
  c1. processing the gate level design to identify signals of the gate level design that correspond to signals of the RTL design;
  c2. generating a program for causing a circuit simulator to simulate behavior of the IC described by the gate level design such that the simulator produces the first gate level dump file, wherein the first gate level dump file references and described behavior of signals of the gate level design identified at step c1 as corresponding to signals of the RTL design, and refrains from referencing and describing behavior of signals of the gate level design that do not correspond to signals of the RTL design.

4. The method in accordance with claim 1 comprising the steps of:
  f. fabricating the IC described by the gate level design;
  g. testing the IC described by the gate level design to produce test data indicating behavior of IC signals in response to time-varying signals supplied as inputs to the IC;
  h. processing the test data to generate a second RTL dump file referencing signals of the RTL design and indicating how the signals of the RTL design behaved during the test;
  i. processing the second RTL dump file to produce displays depicting behavior of signals of the RTL design indicated by the second RTL dump file.

5. The method in accordance with claim 4
wherein the second RTL dump file references each signal of the RTL design according its position within the hierarchy of modules; and
wherein the gate level design uniquely names every signal generated by every cell, and the gate level dump file references each signal of the gate level design according to its unique name.

6. The method in accordance with claim 4 wherein the test data indicates when IC signals fail to take on states predicted by the second gate level dump file.

7. The method in accordance with claim 4,
wherein logic blocks within the IC communicate with one another via signals passing through clocked logic devices forming at least one scan chain;
wherein the test data comprises scan chain data read out of said at least one scan chain that represents states of the signals passing through the clocked logic devices; and
wherein step g comprises processing the scan chain data to determine how signals of the RTL design behaved during the test.

* * * * *